US009236314B2

(12) United States Patent
Chudzik et al.

(10) Patent No.: US 9,236,314 B2
(45) Date of Patent: Jan. 12, 2016

(54) HIGH-K/METAL GATE STACK USING CAPPING LAYER METHODS, IC AND RELATED TRANSISTORS

(75) Inventors: Michael P. Chudzik, Danbury, CT (US); Naim Moumen, Walden, NY (US); Vijay Narayanan, New York, NY (US); Dae-Gyu Park, Poughquaq, NY (US); Vamsi K. Paruchuri, New York, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 885 days.

(21) Appl. No.: 13/433,659

(22) Filed: Mar. 29, 2012

(65) Prior Publication Data

US 2012/0184093 A1    Jul. 19, 2012

Related U.S. Application Data

(62) Division of application No. 11/954,749, filed on Dec. 12, 2007, now abandoned.

(51) Int. Cl.
  *H01L 21/8238*   (2006.01)
  *H01L 29/49*   (2006.01)
  *H01L 29/51*   (2006.01)

(52) U.S. Cl.
  CPC *H01L 21/823857* (2013.01); *H01L 21/823842* (2013.01); *H01L 29/4966* (2013.01); *H01L 29/4975* (2013.01); *H01L 29/517* (2013.01)

(58) Field of Classification Search
  CPC .............. H01L 21/823828; H01L 21/823842; H01L 21/82385; H01L 21/823857; H01L 27/0922; H01L 29/49; H01L 29/4966; H01L 21/517
  See application file for complete search history.

(56) References Cited

U.S. PATENT DOCUMENTS

| 7,105,889 | B2 | 9/2006 | Bojarczuk, Jr. et al. |
| 7,115,959 | B2 | 10/2006 | Andreoni et al. |
| 7,378,713 | B2 | 5/2008 | Hsu et al. |
| 2002/0142624 | A1 | 10/2002 | Levy et al. |
| 2004/0023478 | A1 | 2/2004 | Samavedam et al. |
| 2004/0106249 | A1 | 6/2004 | Huotari |
| 2005/0224897 | A1 | 10/2005 | Chen et al. |
| 2005/0280105 | A1 | 12/2005 | Andreoni et al. |

(Continued)

OTHER PUBLICATIONS

Vieira, Office Action Communications for U.S. Appl. No. 11/954,749 dated Oct. 3, 2013, 16 pages.

(Continued)

*Primary Examiner* — Phat X Cao
*Assistant Examiner* — Diana C Vieira
(74) *Attorney, Agent, or Firm* — Anthony J. Cusick; Hoffman Warnick LLC

(57) ABSTRACT

Methods, IC and related transistors using capping layer with high-k/metal gate stacks are disclosed. In one embodiment, the IC includes a first type transistor having a gate electrode including a first metal, a second metal and a first dielectric layer, the first dielectric layer including oxygen; a second type transistor separated from the first type transistor by an isolation region, the second type transistor having a gate electrode including the second metal having a work function appropriate for the second type transistor and the first dielectric layer; and wherein the gate electrode of the first type transistor includes a rare earth metal between the first metal and the second metal and the gate electrode of the second type transistor includes a second dielectric layer made of an oxide of the rare earth metal.

8 Claims, 3 Drawing Sheets

(56) References Cited

U.S. PATENT DOCUMENTS

| | | | |
|---|---|---|---|
| 2006/0084247 A1 | 4/2006 | Liu | |
| 2006/0289903 A1 | 12/2006 | Andreoni et al. | |
| 2007/0148838 A1 | 6/2007 | Doris et al. | |
| 2007/0152276 A1 | 7/2007 | Arnold et al. | |
| 2007/0272975 A1* | 11/2007 | Schaeffer et al. | 257/327 |
| 2008/0280404 A1* | 11/2008 | Chudzik et al. | 438/199 |
| 2009/0039447 A1 | 2/2009 | Copel et al. | |

OTHER PUBLICATIONS

Vieira, Office Action Communications for U.S. Appl. No. 11/954,749 dated Apr. 17, 2014, 15 pages.

Diana C. Garrity, USPTO Office Action, U.S. Appl. No. 11/954,749, Notification Date Mar. 17, 2010, 14 pages.

Diana C. Garrity, USPTO Final Office Action, U.S. Appl. No. 11/954,749, Notification Date Jul. 26, 2010, 13 pages.

Diana C. Garrity, USPTO Office Action, U.S. Appl. No. 11/954,749, Notification Date Sep. 30, 2010, 12 pages.

Diana C. Garrity, USPTO Final Office Action, U.S. Appl. No. 11/954,749, Notification Date Feb. 10, 2011, 14 pages.

Diana C. Garrity, USPTO Office Action, U.S. Appl. No. 11/954,749, Notification Date Apr. 11, 2011, 17 pages.

Diana C. Garrity, USPTO Final Office Action, U.S. Appl. No. 11/954,749, Notification Date Aug. 26, 2011, 17 pages.

* cited by examiner

HIGH-K/METAL GATE STACK USING CAPPING LAYER METHODS, IC AND RELATED TRANSISTORS

This application is a divisional application of co-pending U.S. patent application Ser. No. 11/954,749, filed on Dec. 12, 2007, which is hereby incorporated herein.

BACKGROUND

1. Technical Field

The disclosure relates generally to integrated circuit (IC) fabrication, and more particularly, to forming of high dielectric constant (high-k) and metal gate stacks using a capping layer.

2. Background Art

In the integrated circuit (IC) fabrication industry, metal gate electrodes are being pursued for, for example, the 45 nanometer (nm) and 32 nm technology nodes as a replacement for doped polysilicon (poly-Si) gate electrodes for a number of reasons. Metal gate electrodes include a high dielectric constant (high-k) dielectric within a metal gate stack. The best known self aligned process flows for complementary metal oxide semiconductor (CMOS) fabrication with the high-k dielectrics and metal gate stack use a dual field effect transistor (FET) threshold voltage (Vt) work function tuning layers scheme to tune the threshold voltage of adjacent n-type metal oxide semiconductor (NMOS) region (for NFETs) and p-type metal oxide semiconductor (PMOS) region (for PFETs). That is, dual metal/dual dielectric gate stacks. One challenge for this technology is that the continual reduction in device dimensions that define, for example, the 45 nm and 32 nm technology nodes, impose an ever reducing distance between the different active regions, e.g., approximately 102 nm for the 45 nm node and approximately 72 nm for the 32 nm node. The reduction in device dimensions presents a problem because tuning layers for NMOS and PMOS regions are not interchangeable. As a result, in order to accommodate formation of the appropriate gate stack for each region, gate stack layers particular to each region must be formed in both regions and then the opposing NMOS and PMOS region's stack must be completely removed, which is costly and induces process variations. Since the distance between active regions is so small, etching the gate stacks and continuing to meet ground rule restrictions is currently unachievable for the 45 nm and 32 nm CMOS technology nodes, and beyond. In particular, the ability to form material layers such that they are thin enough to fill a gap between partially formed gate stacks and such that the materials can be removed from the gap to ultimately form the gate stacks in the NMOS and PMOS regions is currently unfeasible. Butted junctions are also not available using current practices because of the removal of layers between the different NMOS and PMOS gate stacks.

SUMMARY

Methods, IC and related transistors using capping layer with high-k/metal gate stacks are disclosed. In one embodiment, the IC includes a first type transistor having a gate electrode including a first metal, a second metal and a first dielectric layer, the first dielectric layer including oxygen; a second type transistor separated from the first type transistor by an isolation region, the second type transistor having a gate electrode including the second metal having a work function appropriate for the second type transistor and the first dielectric layer; and wherein the gate electrode of the first type transistor includes a rare earth metal between the first metal and the second metal and the gate electrode of the second type transistor includes a second dielectric layer made of an oxide of the rare earth metal.

A first aspect of the disclosure provides a method comprising: providing an implanted substrate with a n-type metal oxide semiconductor (NMOS) region and a p-type metal oxide semiconductor (PMOS) region; depositing a high dielectric constant (high-k) dielectric layer over the implanted substrate; forming a first metal having a work function commensurate with a first one of the NMOS region and the PMOS region over the first one of the NMOS and the PMOS regions only, leaving the high-k dielectric layer exposed over a second one of the NMOS and PMOS regions; depositing a second metal having a work function commensurate with the second one of the NMOS region and the PMOS region over the implanted substrate; depositing a polysilicon over the implanted substrate; and patterning to form a first gate stack over the NMOS region and a second gate stack over the PMOS region on the implanted substrate.

A second aspect of the disclosure provides an integrated circuit comprising: a first type transistor having a gate electrode including a first metal, a second metal and a first dielectric layer, the first dielectric layer including oxygen; a second type transistor separated from the first type transistor by an isolation region, the second type transistor having a gate electrode including the second metal having a work function appropriate for the second type transistor and the first dielectric layer; and wherein the gate electrode of the first type transistor includes a rare earth metal between the first metal and the second metal and the gate electrode of the second type transistor includes a second dielectric layer made of an oxide of the rare earth metal.

A third aspect of the disclosure provides a transistor comprising: a gate stack including: a high dielectric constant (high-k) dielectric layer over a substrate, a capping layer including an oxide of a rare earth metal over the high-k dielectric layer, a metal over the oxide of the rare earth metal, the metal having a work function commensurate with a well in the substrate, and a polysilicon over the metal.

A fourth aspect of the disclosure provides a transistor comprising: a gate stack including: a high dielectric constant (high-k) dielectric layer over a substrate, the high-k dielectric layer including oxygen, a first metal having a work function commensurate with a well in the substrate, a capping layer including a rare earth metal over the first metal, a second metal over the capping layer, the second metal having a work function incompatible with the well in the substrate, and a polysilicon over the second metal.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
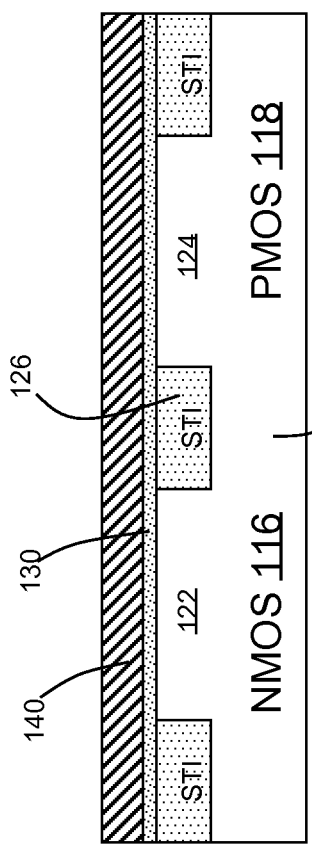
FIGS. 1-6 show embodiments of a method according to the disclosure, with FIG. 6 showing embodiments of an integrated circuit (IC) and related transistors according to the disclosure.

Referring to the drawings, embodiments of a method according to the disclosure are shown in FIGS. 1-6. FIG. 1 shows providing an implanted substrate 120 including an n-type metal oxide semiconductor (NMOS) region 116 and a p-type metal oxide semiconductor (PMOS) region 118. In particular, NMOS region 116 and PMOS region 118 may include a doped N-well 122 and doped P-well 124, respectively, separated by an isolation region 126, e.g., a shallow trench isolation (STI) of silicon oxide. N-type and p-type dopants may be any appropriate dopants now known or later developed. Implanted substrate 120 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 120 may be strained. Implanted substrate 120 may be formed using any now known or later developed processes, e.g., deposition, masking, ion implantation, etc.

FIG. 1 also shows depositing a high dielectric constant (high-k) dielectric layer 130 over implanted substrate 120. In one embodiment, high-k dielectric layer 130 may include any dielectric including oxygen and having dielectric constant greater than that of the vacuum level (K>1). High-k dielectric 130 may include, but is not limited to: hafnium oxide ($HfO_2$), aluminum oxide ($Al_2O_3$), lanthanum oxide ($La_2O_3$), hafnium silicon oxide ($HfSiO_x$), hafnium aluminum oxide (HfAlO), zirconium oxide (ZrO), zirconium silicon oxide (ZrSiO), yttrium oxide ($Y_2O_3$), strontium oxide (SrO) and strontium titanium oxide (SrTiO). "Depositing," as used herein, may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
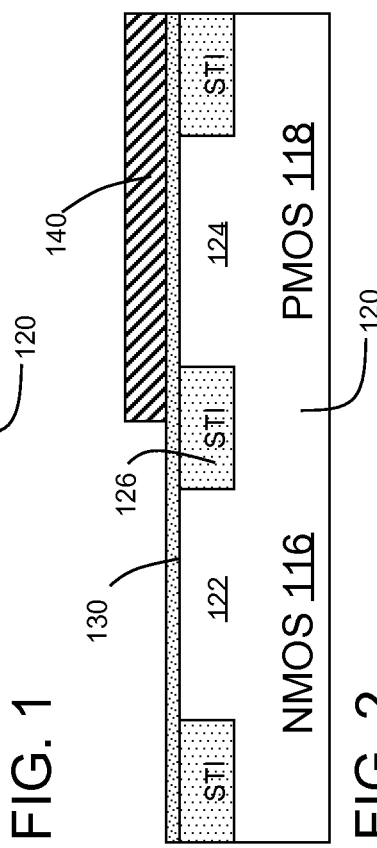

FIGS. 1-2 show forming of a first metal 140 (e.g., deposited or grown (FIG. 1)) having a work function commensurate with a first one of NMOS region 116 and PMOS region 118 over the first one of NMOS and PMOS regions 116, 118 only. As used herein, "commensurate with" indicates that the metal is commensurate with a doping of the region 116, 118 in question, i.e., it's work function enhances performance of devices built in that particular region. As illustrated, first metal 140 is formed over PMOS region 118, and thus first metal 140 would be commensurate with PMOS region 118. For example, first metal 140 would have a work function that would cause a threshold voltage to a band edge for a PFET 200 (FIG. 6) to be formed over PMOS region 118. First metal 140 may be deposited, as shown in FIG. 1, and then patterned and etched off of a second one of NMOS and PMOS regions 116, 118, as shown in FIG. 2, leaving high-k dielectric layer 130 exposed over the second one of NMOS and PMOS regions 116, 118. In this case, high-k dielectric layer 130 of NMOS region 116 is exposed. This is in contrast to conventional techniques that would remove high-k dielectric layer 130 from NMOS region 116. First metal 140 may be removed using any now known or later developed technique, e.g., depositing a photoresist, patterning and etching the photoresist and etching first metal 140 using the photoresist. It is emphasized that first metal 140 may be for either NMOS region 116 or PMOS region 118, i.e., the order of which region is generated first may switch without departing from the scope of the disclosure. Where first metal 140 is over PMOS region 118, first metal 140 may include, but is not limited to: titanium nitride (TiN), ruthenium (Ru), tantalum nitride (TaN), tantalum carbide (TaC), titanium carbide (TiC), titanium oxy-nitride (TiON), rhenium (Re), tungsten (W), tantalum silicon nitride (TaSiN), iridium (Ir), nickel silicide (NiSi), iridium silicide (IrSi), niobium (Nb), vanadium (V) and aluminum (Al).

Figure 3:
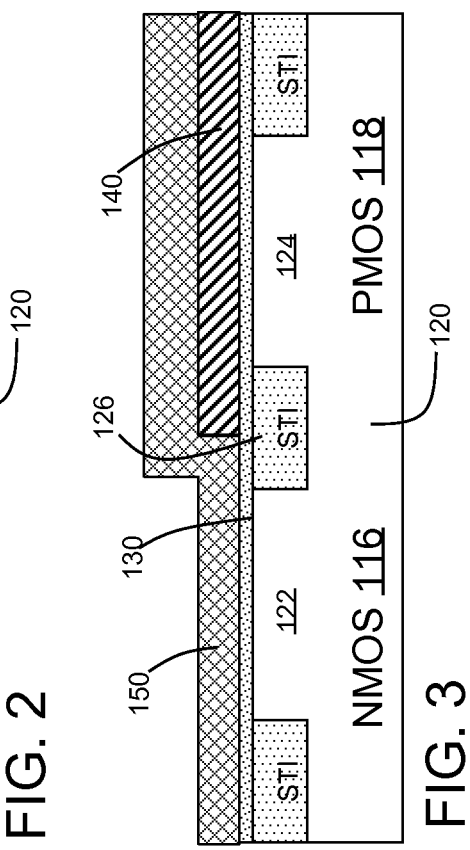

FIG. 3 shows depositing a second metal 150 having a work function commensurate with the second one of NMOS and PMOS regions 116, 118 over implanted substrate 120. In the illustrative case, the second one is the NMOS region 116. Where second metal 150 is over NMOS region 116, second metal 150 may include, but is not limited to: titanium nitride (TiN}, ruthenium (Ru), tantalum nitride (TaN), tantalum carbide (TaC), titanium carbide (TiC), titanium oxy-nitride (TiON), rhenium (Re), tungsten (W), tantalum silicon nitride (TaSiN), iridium (Ir), nickel silicide (NiSi), iridium silicide (IrSi), niobium (Nb), vanadium (V) and aluminum (Al). It is understood that the metal over NMOS may be also selected from this list when it is the first metal deposited, rather than the second as illustrated. Similarly, it is understood that the metal over PMOS may be selected from the above-described list therefor when it is the second metal deposited, rather than the first as illustrated.

Figure 4:
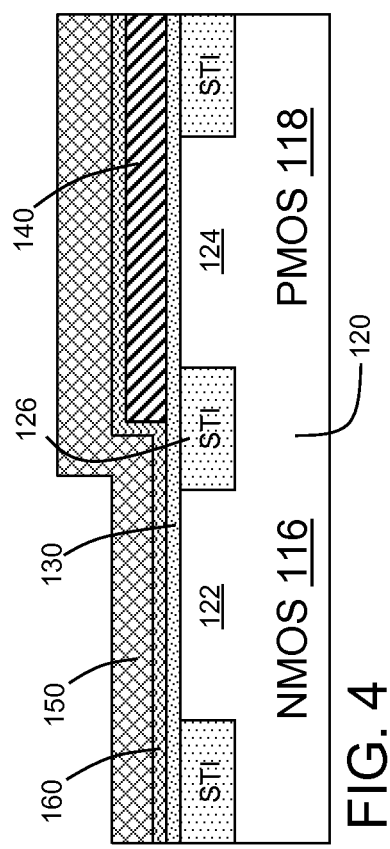
Figure 5:
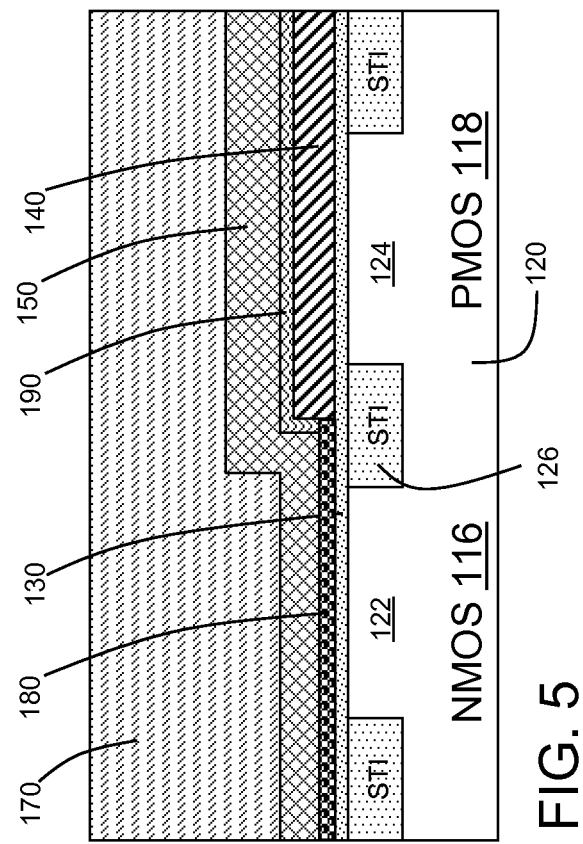

FIG. 4 shows an optional process that includes depositing a capping layer 160 over implanted substrate 120 prior to depositing second metal 150, then depositing second metal 150. Capping layer 160 can take a variety of forms. In one embodiment, capping layer 160 includes but is not limited to a dielectric such as: lanthanum oxide ($La_2O_3$), dysprosium oxide (DyO), yttrium oxide ($Y_2O_3$), barium oxide (BaO), strontium oxide (SrO), scandium oxide (ScO), cerium oxide (CeO), praseodymium oxide (PrO), neodymium oxide (NdO), gadolinium oxide (GdO), erbium oxide (ErO). In this case, capping layer 160 may provide extra threshold voltage (Vt) shift - here NFET capping layer. In another embodiment, capping layer 160 may include a metal such as, but not limited to: lanthanum (La), dysprosium (Dy), yttrium (Y), strontium (Sr), scandium (Sc), barium (Ba), cerium (Ce), praseodymium (Pr), neodymium (Nd), gadolinium (Gd), erbium (Er). In another embodiment, as shown in FIG. 5, capping layer 160 includes a metal, typically a rare earth metal, that reacts with high-k dielectric layer 130 over the first one of the NMOS and PMOS regions (i.e., NMOS region 116 as illustrated) to form a dielectric 180, but remains metallic 190 over the second one of the NMOS and PMOS regions 116, 118 (i.e., PMOS region 116 as illustrated). The rare earth metal may include a multilayer composite of metals (known as a bilayer). In terms of dielectric 180, rare earth metal reacts with the oxygen in high-k dielectric layer 130 to form an oxide that is formed from the rare earth metal. Where rare earth metal 190 remains metallic it is sealed between first metal 140 and second metal 150, and thus is sealed against reaction with the atmosphere. Capping layer 160 may include a rare earth metal such as, but not limited to: ytterbium (Yb), dysprosium (Dy), lanthanum (La), yttrium (Y), strontium (Sr), scandium (Sc), barium (Ba), cerium (Ce), praseodymium (Pr), neodymium (Nd), gadolinium (Gd) and erbium (Er).

Figure 6:
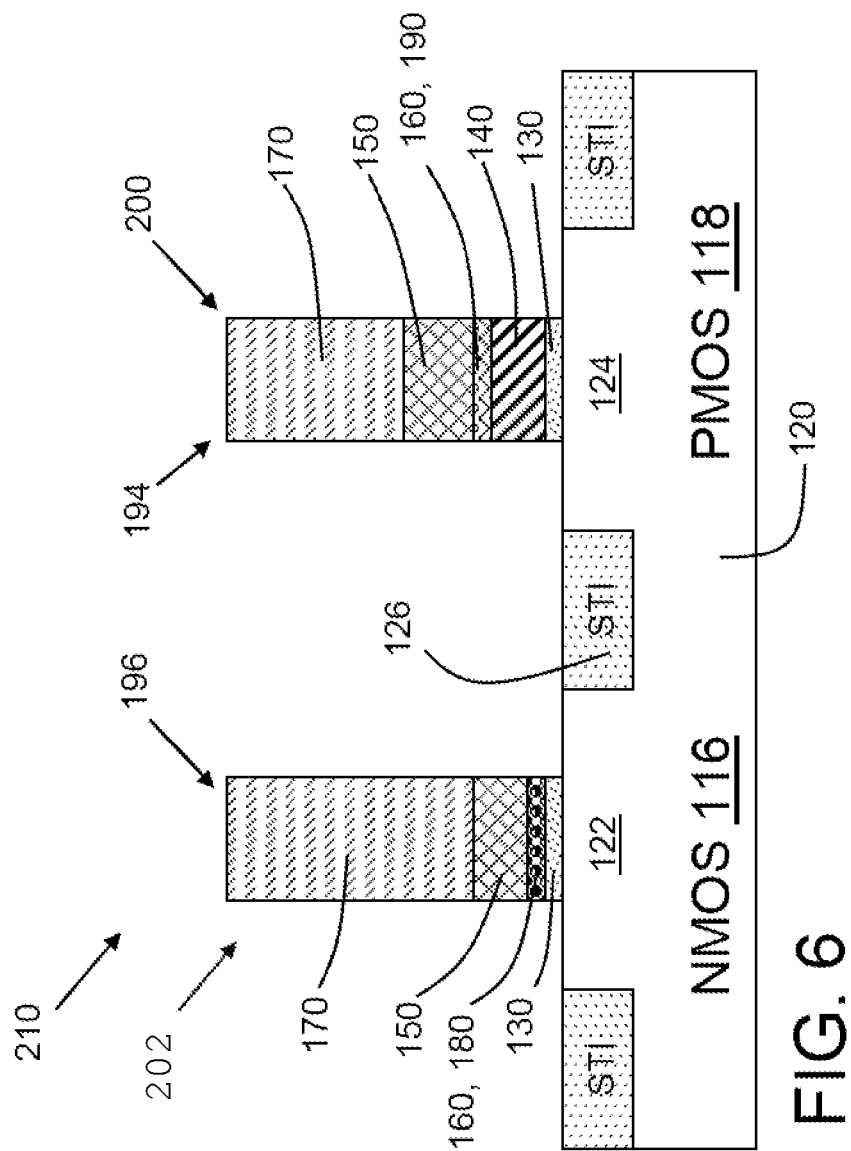

FIG. 5 shows depositing a polysilicon 170 over implanted substrate 120 based on the FIG. 4 embodiment. FIG. 6 shows patterning to form a first gate stack 194 over NMOS region 116 and a second gate stack 196 over PMOS region 118 on implanted substrate 120. As understood, each gate stack 194, 196 eventually becomes a gate electrode 194, 196 for an n-type field effect transistor (NFET) 202 and a p-type field effect transistor (PFET) 200, respectively. An integrated circuit 210 including PFET 200 and NFET 202 thus includes a first type transistor (i.e., PFET 200 as illustrated) having gate electrode 194 including a first metal 140, a second metal 150 having a work function commensurate with the second type transistor (i.e., NFET 202 as illustrated) and a first dielectric layer 130 including oxygen. IC 210 also includes a second type transistor (i.e., NFET 202 as illustrated) separated from first type transistor (PFET) 200 by an isolation region 126. The second type transistor (NFET) 202 includes gate electrode 196 including second metal 150 and first dielectric layer 130. Gate electrode 194 of first type transistor (PFET) 200 also includes a rare earth metal 190 between first metal 140 and second metal 150, and gate electrode 196 of second type transistor (NFET) 202 includes a second dielectric layer 180 made of an oxide of the rare earth metal. First dielectric layer 130 is under first metal 140 in PFET 200 so as to act as a gate dielectric for gate electrode 194. Similarly, second dielectric layer 180 contacts first dielectric layer 130 in first type transistor (NFET) 202, and thus collectively act as a gate dielectric for gate electrode 196. Each gate electrode 194, 196 further includes a polysilicon portion 170. In one embodiment, second metal 150 in first type transistor (PFET) 200 and second type transistor (NFET) 202 are electrically coupled, which is impossible with conventional processing due to the gap that forms between devices during the patterning and removal process.

As also shown in FIG. 6, a transistor 200 includes gate stack 194 including high-k dielectric layer 130 over substrate 120, first metal 140 having a work function commensurate with a well 124 in the substrate, capping layer 160 including a rare earth metal 190 over first metal 140, a second metal 150 over capping layer 160, and a polysilicon 170 over second metal 150. In this case, second metal 150 has a work function incompatible with well 124 (p-well) in substrate 120, i.e., it is harmful to threshold voltage (Vt) if allowed to impact operation. Transistor (NFET) 202 includes a gate stack 196 including high-k dielectric layer 130 over substrate 120, capping layer 160 including an oxide 180 of a rare earth metal over high-k dielectric layer 130, a metal 150 over the oxide of the rare earth metal, the metal having a work function commensurate with a well 122 (n-well) in substrate 120, and a polysilicon 170 over the metal 150.

The above-described methods, IC and transistors incorporate a capping layer in the form of an rare earth metal to intermix with high-k dielectric layer 130 (and not the metal 150) to shift the work function of the NMOS region 116 to band-edge, but when interposed in the metals 140, 150 they do not cause a threshold voltage shift in the PMOS region 118. In addition, the methods allow for meeting of ground rules, and do not require removal of both NMOS and PMOS region metals form the opposing region. The methods also allow for butted junctions with the NFET 202 always self-aligned to PFET 200 since only one metal layer is removed over isolation region 126, i.e., second metal 150.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:
   providing an implanted substrate with a n-type metal oxide semiconductor (NMOS) region and a p-type metal oxide semiconductor (PMOS) region;
   depositing a high dielectric constant (high-k) dielectric layer over the implanted substrate;
   forming a first metal having a work function commensurate with a first one of the NMOS region and the PMOS region over the first one of the NMOS and the PMOS regions only, leaving the high-k dielectric layer exposed over a second one of the NMOS and PMOS regions;
   depositing a second metal having a work function commensurate with the second one of the NMOS region and the PMOS region over the implanted substrate, wherein a capping layer including a dielectric is deposited over the implanted substrate prior to depositing the second metal, wherein the capping layer is selected from the group consisting of: lanthanum oxide ($La_2O_3$), dysprosium oxide (DyO), yttrium oxide ($Y_2O_3$), barium oxide (BaO), strontium oxide (SrO), scandium oxide (ScO), cerium oxide (CeO), praseodymium oxide (PrO), neodymium oxide (NdO), gadolinium oxide (GdO), and erbium oxide (ErO);
   depositing a polysilicon over the implanted substrate; and
   patterning to form a first gate stack over the NMOS region and a second gate stack over the PMOS region on the implanted substrate.

2. The method of claim 1, wherein the capping layer includes a metal selected from the group consisting of: lanthanum (La), dysprosium (Dy), yttrium (Y), strontium (Sr), scandium (Sc), barium (Ba), cerium (Ce), praseodymium (Pr), neodymium (Nd), gadolinium (Gd), and erbium (Er).

3. The method of claim 1, wherein the high-k dielectric layer is selected from the group consisting of: hafnium oxide ($HfO_2$), aluminum oxide ($Al_2O_3$), lanthanum oxide ($La_2O_3$), hafnium silicon oxide ($HfSiO_x$), hafnium aluminum oxide (HfAlO), zirconium oxide (ZrO), zirconium silicon oxide (ZrSiO), yttrium oxide ($Y_2O_3$), strontium oxide (SrO) and strontium titanium oxide (SrTiO).

4. The method of claim 1, wherein the first one of the NMOS and PMOS region is the PMOS region, and the first metal is selected from the group consisting of:
titanium nitride (TiN), ruthenium (Ru), tantalum nitride (TaN), tantalum carbide (TaC), titanium carbide (TiC), titanium oxy-nitride (TiON), rhenium (Re), tungsten (W), tantalum silicon nitride (TaSiN), iridium (Ir), nickel silicide (NiSi), iridium silicide (IrSi), niobium (Nb), vanadium (V) and aluminum (Al).

5. The method of claim 1, wherein the second one of the NMOS and PMOS region is the NMOS region, and the second metal is selected from the group consisting of: titanium nitride (TiN), ruthenium (Ru), tantalum nitride (TaN), tantalum carbide (TaC), titanium carbide (TiC), titanium oxy-nitride (TiON), rhenium (Re), tungsten (W), tantalum silicon nitride (TaSiN), iridium (Ir), nickel silicide (NiSi), iridium silicide (IrSi), niobium (Nb), vanadium (V) and aluminum (Al).

6. A method comprising:
depositing a high dielectric constant (high-k) dielectric layer over an implanted substrate having an n-type metal oxide semiconductor (NMOS) region and a p-type metal oxide semiconductor (PMOS) region;
forming a first metal having a work function commensurate with the NMOS region over the NMOS region only, leaving the high-k dielectric layer exposed over the PMOS region;
depositing a second metal having a work function commensurate with the PMOS region over the implanted substrate, wherein a capping layer including a dielectric is deposited over the implanted substrate prior to depositing the second metal, wherein the capping layer is selected from the group consisting of: lanthanum oxide ($La_2O_3$), dysprosium oxide (DyO), yttrium oxide ($Y_2O_3$), barium oxide (BaO), strontium oxide (SrO), scandium oxide (ScO), cerium oxide (CeO), praseodymium oxide (PrO), neodymium oxide (NdO), gadolinium oxide (GdO), and erbium oxide (ErO);
depositing a polysilicon over the implanted substrate; and
patterning to form a first gate stack over the NMOS region and a second gate stack over the PMOS region on the implanted substrate.

7. The method of claim 6, wherein the capping layer includes a metal.

8. A method comprising:
depositing a high dielectric constant (high-k) dielectric layer over an implanted substrate having an n-type metal oxide semiconductor (NMOS) region and a p-type metal oxide semiconductor (PMOS) region;
forming a first metal having a work function commensurate with the PMOS region over the PMOS region only, leaving the high-k dielectric layer exposed over the NMOS region;
depositing a second metal having a work function commensurate with the NMOS region over the implanted substrate, wherein a capping layer including a dielectric is deposited over the implanted substrate prior to depositing the second metal, wherein the capping layer is selected from the group consisting of: lanthanum oxide ($La_2O_3$), dysprosium oxide (DyO), yttrium oxide ($Y_2O_3$), barium oxide (BaO), strontium oxide (SrO), scandium oxide (ScO), cerium oxide (CeO), praseodymium oxide (PrO), neodymium oxide (NdO), gadolinium oxide (GdO), and erbium oxide (ErO);
depositing a polysilicon over the implanted substrate; and
patterning to form a first gate stack over the NMOS region and a second gate stack over the PMOS region on the implanted substrate.

* * * * *